(12) United States Patent
Gupta et al.

(10) Patent No.: US 9,449,749 B2
(45) Date of Patent: Sep. 20, 2016

(54) SIGNAL HANDLING APPARATUS FOR RADIO FREQUENCY CIRCUITS

(71) Applicant: TDK Corporation, Tokyo (JP)

(72) Inventors: Dev V. Gupta, Acton, MA (US); Zhiguo Lai, Acton, MA (US); Medhi Si Moussa, Acton, MA (US)

(73) Assignee: TDK Corporation, Tokyo (JP)

( * ) Notice: Subject to any disclaimer, the term of this patent is extended or adjusted under 35 U.S.C. 154(b) by 135 days.

(21) Appl. No.: 14/025,069

(22) Filed: Sep. 12, 2013

(65) Prior Publication Data

US 2014/0354370 A1 Dec. 4, 2014

Related U.S. Application Data

(60) Provisional application No. 61/828,107, filed on May 28, 2013, provisional application No. 61/857,446, filed on Jul. 23, 2013.

(51) Int. Cl.
*H01P 5/12* (2006.01)
*H01F 17/00* (2006.01)
(Continued)

(52) U.S. Cl.
CPC ............ *H01F 17/0013* (2013.01); *H01G 4/38* (2013.01); *H01G 4/40* (2013.01); *H01G 5/38* (2013.01);
(Continued)

(58) Field of Classification Search
CPC .......... H01F 17/0013; H01F 2017/0026; H03H 7/0138; H03H 7/01; H03H 7/138; H03H 5/003; H03H 7/0153; H03H 7/48; H03H 11/1291; H03H 2210/025; H03H 2210/036; H03H 2240/00; H01G 4/40; H01G 4/38; H01G 5/38; H01L 23/642; H01L 27/0811; H01L 28/10; H01L 2244/32225; H01L 2224/48091; H01L 2224/48227; H01L 2224/48465; H01L 2224/83385; H01L 2924/0002
USPC .......................................................... 333/126
See application file for complete search history.

(56) References Cited

U.S. PATENT DOCUMENTS 4,363,009 A 12/1982 Malcolm et al.
4,423,396 A 12/1983 Makimoto et al.
(Continued)

FOREIGN PATENT DOCUMENTS

EP 0 581 702 A1 2/1994
EP 0 716 468 B1 10/2001
(Continued)

OTHER PUBLICATIONS

Ou Hok Huor et al., "Design of Super High Power Saw Filter", IEEE Ultrasonics Symposium 1991, vol. 1, Dec. 8, 1991, pp. 161-166.
(Continued)

*Primary Examiner* — Robert Pascal
*Assistant Examiner* — Kimberly Glenn
(74) *Attorney, Agent, or Firm* — Nixon Peabody LLP

(57) ABSTRACT

A signal handler providing high linearity in a small size, applicable across wide operating frequencies and bandwidths, while also adapted to preferred integrated circuit (IC) and printed circuit board technologies. In one implementation, a signal handling apparatus includes an input impedance transformer for receiving an input signal and matching an internal apparatus impedance, a splitter for providing N split signals, a number of signal processing circuits for processing the N split signals, a combiner for combining the N split signals into a combined signal, and output impedance transformer for receiving the combined signal and for matching the internal apparatus impedance to an output impedance of the apparatus. The apparatus may provide filtering, duplexing and other radio frequency signal processing functions. A tunable duplexer may be implemented using a vector inductor and tunable capacitor array with frequency dependent impedance transformers.

25 Claims, 16 Drawing Sheets

(51) Int. Cl.

| | | |
|---|---|---|
| *H03H 7/01* | (2006.01) | |
| *H03H 7/38* | (2006.01) | |
| *H01G 5/38* | (2006.01) | |
| *H01G 4/38* | (2006.01) | |
| *H01L 23/64* | (2006.01) | |
| *H01L 27/08* | (2006.01) | |
| *H01G 4/40* | (2006.01) | |
| *H03H 5/00* | (2006.01) | |
| *H03H 7/48* | (2006.01) | |
| *H03H 11/12* | (2006.01) | |
| *H01L 49/02* | (2006.01) | |

(52) U.S. Cl.
CPC ......... *H01L 23/642* (2013.01); *H01L 27/0811* (2013.01); *H03H 7/01* (2013.01); *H03H 7/0138* (2013.01); *H03H 7/38* (2013.01); *H01F 2017/0026* (2013.01); *H01L 28/10* (2013.01); *H01L 2224/32225* (2013.01); *H01L 2224/48091* (2013.01); *H01L 2224/48227* (2013.01); *H01L 2224/48465* (2013.01); *H01L 2224/83385* (2013.01); *H01L 2924/0002* (2013.01); *H01L 2924/15311* (2013.01); *H03H 5/003* (2013.01); *H03H 7/0153* (2013.01); *H03H 7/48* (2013.01); *H03H 11/1291* (2013.01); *H03H 2210/025* (2013.01); *H03H 2210/036* (2013.01); *H03H 2240/00* (2013.01)

(56) References Cited

U.S. PATENT DOCUMENTS

| | | | |
|---|---|---|---|
| 4,456,895 A | 6/1984 | Landt et al. | |
| 4,754,242 A | 6/1988 | Okamura et al. | |
| 4,878,151 A | 10/1989 | Gallichio | |
| 5,208,597 A | 5/1993 | Early et al. | |
| 5,227,746 A | 7/1993 | Esaki et al. | |
| 5,321,597 A | 6/1994 | Alacoque | |
| 5,452,178 A | 9/1995 | Emesh et al. | |
| 5,530,415 A | 6/1996 | Takaya et al. | |
| 5,543,751 A * | 8/1996 | Stedman et al. | 330/124 D |
| 5,621,366 A | 4/1997 | Gu et al. | |
| 6,124,624 A | 9/2000 | Van Roosmalen et al. | |
| 6,198,374 B1 | 3/2001 | Abel | |
| 6,211,745 B1 | 4/2001 | Mucke et al. | |
| 6,222,221 B1 | 4/2001 | Hou et al. | |
| 6,293,001 B1 | 9/2001 | Uriu et al. | |
| 6,351,020 B1 | 2/2002 | Tarabbia et al. | |
| 6,377,075 B1 | 4/2002 | Wong | |
| 6,410,954 B1 | 6/2002 | Sowlati et al. | |
| 6,437,677 B1 | 8/2002 | Takeuchi et al. | |
| 6,438,000 B1 | 8/2002 | Okamoto et al. | |
| 6,472,960 B1 | 10/2002 | Ishikawa et al. | |
| 6,608,538 B2 | 8/2003 | Wang | |
| 6,657,509 B1 | 12/2003 | Ohannes | |
| 6,664,882 B2 | 12/2003 | Andoh et al. | |
| 6,674,321 B1 | 1/2004 | York | |
| 6,765,778 B1 | 7/2004 | Du et al. | |
| 6,882,548 B1 | 4/2005 | Jacobs et al. | |
| 6,885,081 B2 | 4/2005 | Morimoto | |
| 6,940,386 B2 | 9/2005 | Mukherjee et al. | |
| 7,000,000 B1 | 2/2006 | O'Brien | |
| 7,023,316 B2 | 4/2006 | Ahn et al. | |
| 7,212,789 B2 | 5/2007 | Kuffner | |
| 7,245,519 B2 | 7/2007 | McQuirk et al. | |
| 7,251,121 B2 | 7/2007 | Bhutta | |
| 7,253,704 B2 | 8/2007 | Park et al. | |
| 7,255,801 B2 | 8/2007 | Chen | |
| 7,280,001 B2 | 10/2007 | Maligeorgos et al. | |
| 7,408,422 B2 | 8/2008 | Dedieu et al. | |
| 7,439,828 B2 | 10/2008 | Wada | |
| 7,446,628 B2 | 11/2008 | Morris, III | |
| 7,453,136 B2 | 11/2008 | Hakkarainen | |
| 7,528,667 B1 | 5/2009 | Tan et al. | |
| 7,576,627 B2 | 8/2009 | Shastry et al. | |
| 7,586,389 B2 | 9/2009 | Ali-Ahmed et al. | |
| 7,656,251 B1 | 2/2010 | Bauder et al. | |
| 7,692,527 B2 | 4/2010 | Ito et al. | |
| 7,719,083 B2 | 5/2010 | Chang | |
| 7,728,427 B2 | 6/2010 | Gabara | |
| 7,920,030 B2 | 4/2011 | Jang et al. | |
| 8,134,222 B2 | 3/2012 | Khan et al. | |
| 8,203,419 B2 | 6/2012 | Nazarian et al. | |
| 8,204,031 B2 | 6/2012 | Jian et al. | |
| 8,289,103 B2 | 10/2012 | Yamakawa et al. | |
| 8,289,118 B2 | 10/2012 | Chiu et al. | |
| 8,324,069 B1 | 12/2012 | Carns et al. | |
| 8,324,692 B2 | 12/2012 | Chen et al. | |
| 8,324,984 B2 | 12/2012 | Gavin et al. | |
| 8,395,880 B2 | 3/2013 | Wasson | |
| 8,531,862 B2 | 9/2013 | Roest et al. | |
| 8,760,241 B1 * | 6/2014 | Ashworth | H04B 7/155 333/126 |
| 9,019,007 B2 | 4/2015 | Gupta et al. | |
| 9,086,709 B2 | 7/2015 | Gupta et al. | |
| 9,110,483 B2 | 8/2015 | Madan et al. | |
| 2002/0140115 A1 | 10/2002 | Inoh et al. | |
| 2002/0158305 A1 | 10/2002 | Dalmia et al. | |
| 2003/0122619 A1 | 7/2003 | Ishida et al. | |
| 2004/0066244 A1 | 4/2004 | Takinami et al. | |
| 2004/0070468 A1 | 4/2004 | Harada | |
| 2004/0140528 A1 | 7/2004 | Kim et al. | |
| 2004/0164836 A1 | 8/2004 | Wang et al. | |
| 2005/0012567 A1 | 1/2005 | Liu | |
| 2005/0030116 A1 | 2/2005 | Takagi | |
| 2005/0064159 A1 | 3/2005 | Amou et al. | |
| 2005/0116797 A1 | 6/2005 | Shamsaifar et al. | |
| 2005/0162234 A1 | 7/2005 | Kobayashi et al. | |
| 2005/0184812 A1 | 8/2005 | Cho | |
| 2005/0237131 A1 | 10/2005 | Chang et al. | |
| 2006/0006431 A1 | 1/2006 | Jean et al. | |
| 2006/0043499 A1 | 3/2006 | De Cremoux et al. | |
| 2006/0077020 A1 | 4/2006 | Wang et al. | |
| 2006/0125121 A1 | 6/2006 | Ko et al. | |
| 2008/0048236 A1 | 2/2008 | Kim | |
| 2008/0197923 A1 | 8/2008 | Nakajima et al. | |
| 2008/0265977 A1 | 10/2008 | Gu | |
| 2009/0033439 A1 | 2/2009 | Igarashi | |
| 2009/0096507 A1 | 4/2009 | Gao et al. | |
| 2009/0128992 A1 | 5/2009 | Haralabiois | |
| 2009/0160263 A1 | 6/2009 | Spears et al. | |
| 2009/0179713 A1 | 7/2009 | Zeng et al. | |
| 2009/0179722 A1 | 7/2009 | Goyette et al. | |
| 2009/0243743 A1 | 10/2009 | Kossel et al. | |
| 2009/0325521 A1 | 12/2009 | Dubash et al. | |
| 2010/0052778 A1 | 3/2010 | Baranauskas | |
| 2010/0079167 A1 | 4/2010 | Thomsen | |
| 2010/0134182 A1 | 6/2010 | Kapoor et al. | |
| 2010/0285769 A1 | 11/2010 | Conroy et al. | |
| 2011/0002080 A1 | 1/2011 | Ranta | |
| 2011/0109380 A1 | 5/2011 | Park et al. | |
| 2011/0121910 A1 | 5/2011 | Yang et al. | |
| 2011/0187487 A1 | 8/2011 | Hsu et al. | |
| 2011/0298526 A1 | 12/2011 | Homol et al. | |
| 2011/0309994 A1 | 12/2011 | Kato et al. | |
| 2011/0316062 A1 | 12/2011 | Kondo et al. | |
| 2012/0146742 A1 | 6/2012 | Caron et al. | |
| 2012/0193771 A1 | 8/2012 | Masuda | |
| 2012/0208473 A1 | 8/2012 | Aparin | |
| 2012/0211868 A1 | 8/2012 | Stribley et al. | |
| 2012/0213015 A1 | 8/2012 | Romanovskyy et al. | |
| 2013/0039228 A1 * | 2/2013 | Caron | H04B 1/52 370/278 |
| 2013/0083703 A1 | 4/2013 | Granger-Jones et al. | |
| 2013/0090080 A1 | 4/2013 | Schmidt | |
| 2013/0093703 A1 | 4/2013 | Yang et al. | |
| 2013/0099864 A1 | 4/2013 | Kawai et al. | |
| 2013/0169378 A1 | 7/2013 | Kim et al. | |
| 2013/0200980 A1 | 8/2013 | Yokoyama et al. | |
| 2013/0257558 A1 | 10/2013 | Kim et al. | |
| 2014/0009211 A1 | 1/2014 | Madan et al. | |
| 2014/0062575 A1 | 3/2014 | Hurwitz | |
| 2014/0266502 A1 | 9/2014 | Gupta et al. | |

(56) References Cited

U.S. PATENT DOCUMENTS

| | | |
|---|---|---|
| 2014/0285299 A1 | 9/2014 | Bojer |
| 2014/0354348 A1 | 12/2014 | Gupta et al. |
| 2014/0354377 A1 | 12/2014 | Gupta et al. |
| 2014/0355171 A1 | 12/2014 | Gupta et al. |
| 2014/0355172 A1 | 12/2014 | Gupta et al. |
| 2014/0367831 A1 | 12/2014 | Yen et al. |
| 2015/0236014 A1 | 8/2015 | Gathman |

FOREIGN PATENT DOCUMENTS

| | | |
|---|---|---|
| EP | 0 780 853 B1 | 9/2002 |
| EP | 1 260 998 A1 | 11/2002 |
| EP | 2 392 382 A1 | 12/2011 |
| JP | S63 308366 | 12/1988 |
| JP | 2006128468 | 5/2006 |
| WO | WO 2006-099419 A1 | 9/2006 |
| WO | WO 2013-028546 A1 | 2/2013 |
| WO | 2014/193502 A1 | 12/2014 |
| WO | 2014/193503 A1 | 12/2014 |
| WO | 2014/193845 A2 | 12/2014 |
| WO | 2014/193846 A1 | 12/2014 |
| WO | WO 2014-193501 A1 | 12/2014 |

OTHER PUBLICATIONS

International Search Report and Written Opinion of the International Searching Authority in counterpart International Appl. No. PCT/US2014/018555, dated Jun. 20, 2014, in 16 pages.

Zhiqiang et al., "A Multi-Band RF CMOS LC Bandpass Filter with Continuous Frequency Tuning Design." 2010 International Conference on Computer Application and System Modeling (ICCASM 2010). 4 pages.

Leifso et al., "A Fully Integrated Active Inductor with Independent Voltage Tunable Inductance and Series-Loss Resistance," IEEE Transaction on Microwave Theory and Techniques, vol. 49, No. 4, Apr. 2001, 7 Pages.

Sauerbrey J., et al., "A 0.7-V MOSFET-Only Switched-OPAMP Sigmadelta Modulator in Standard Digital CMOS Technology", IEEE Journal of Solid-State Circuits, vol. 37, No. 12, Dec. 2002, pp. 1662-1669.

Ming-Jer Chen et al: "A Novel Cross-Coupled Inter-Poly-Oxide Capacitor for Mixed-Mode CMOS Processes", IEEE Electron Device Letters, vol. 20, No. 7, Jul. 1999 (3 pages).

Han Q et al: "Perturbation Analysis and Experimental Verification of Intermodulation and Harmonic Distortion for an Anti-Series Varactor Pair", IEICE Transactions on Electronics, vol. E88-C, No. 1, Jan. 2005, pp. 89-97.

Pietro Andreani et al: "On the Use of MOS Varactors in RF VCO's", IEEE Journal of Solid-State Circuits, vol. 35, No. 6, Jun. 2000 (6 pages).

Kampe, A et al., "An LC-VCO with one octave tuning range," IEEE European Conference on Circuit Theory and Design, vol. 3, Aug. 29, 2005, pp. 321-324.

Nakamura, T et al., "A Low-Phase-Noise Low-Power 27-GHz SiGe—VCO using Merged-Transformer Matching Circuit Technique," IEEE Radio Frequency Integrated Circuits Symposium, Jun. 2007, pp. 413-416.

International Search Report and Written Opinion for International Application No. PCT/US2014/018673, mailed Jun. 5, 2014.

International Search Report and Written Opinion for International Application No. PCT/US2014/039599, mailed Nov. 13, 2014.

Invitation to Pay Additional Fees for International Application No. PCT/US2014/039599, mailed Aug. 12, 2014.

International Search Report and Written Opinion for International Application No. PCT/US2014/018611, mailed Aug. 26, 2014.

Invitation to Pay Additional Fees for International Application No. PCT/US2014/018611, mailed Jun. 10, 2014.

International Search Report and Written Opinion for International Application No. PCT/US2014/039595, mailed Jan. 20, 2015.

Invitation to Pay Additional Fees for International Application No. PCT/US2014/039595, mailed Nov. 6, 2014.

\* cited by examiner

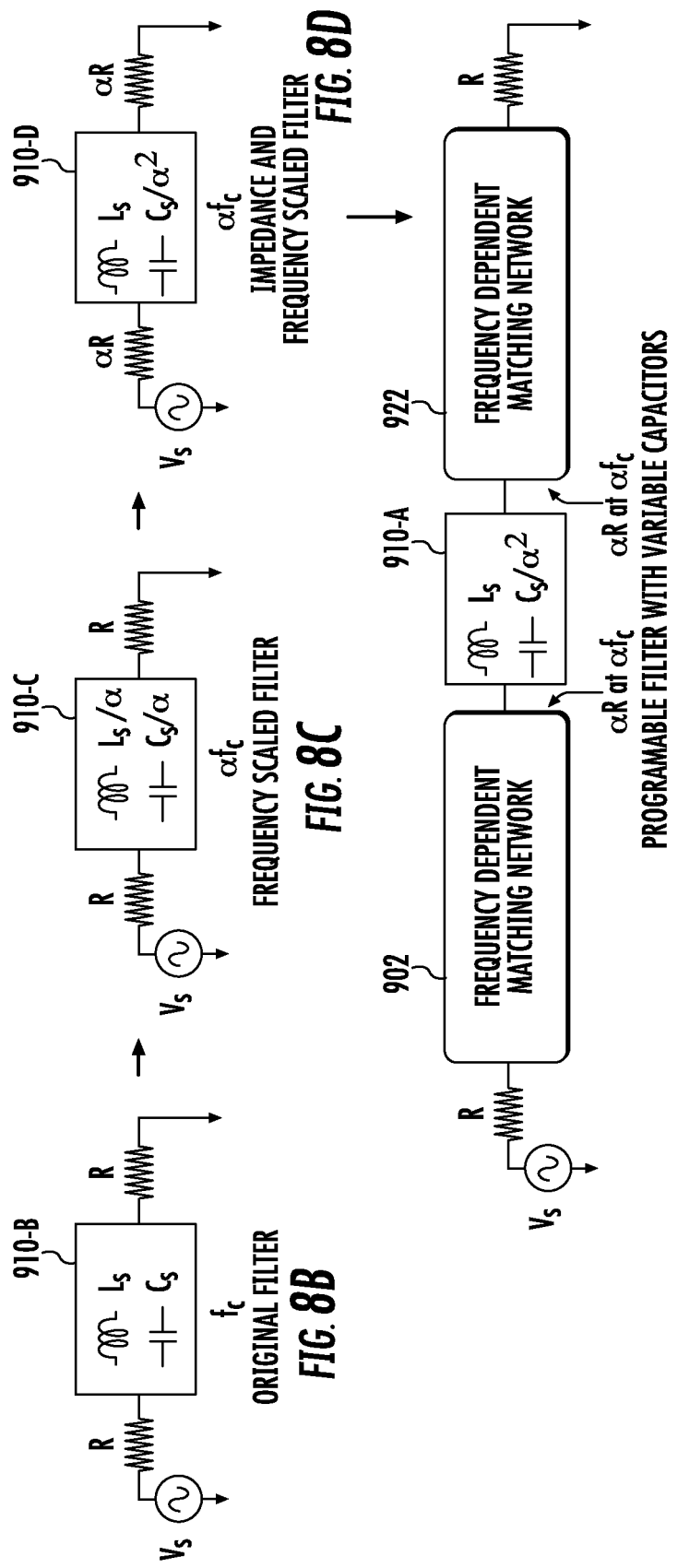

SIGNAL HANDLING APPARATUS FOR RADIO FREQUENCY CIRCUITS

CROSS REFERENCE TO RELATED APPLICATIONS

This application claims the benefit of and priority to a U.S. Provisional Patent Application entitled "Tunable Passive Filter Components", Ser. No. 61/828,107 filed May 28, 2013, and U.S. Provisional Patent Application Entitled "Signal Handling Apparatus for Radio Frequency Circuits", Ser. No. 61/857,446 filed Jul. 23, 2013.

This application is also related to a co-pending U.S. Utility Patent Application entitled "Vector Inductor Having Multiple Mutually Coupled Metalization Layers Providing High Quality Factor", Ser. No. 13/955,617 filed Jul. 31, 2013, and co-pending U.S. Utility Patent Application entitled "Array Capacitor", Ser. No. 14/014,496 filed Aug. 30, 2013. The entire contents every one of the above-referenced applications are hereby incorporated by reference.

BACKGROUND

1. Technical Field

This patent application relates to radio frequency circuits and in particular to a signal handling apparatus and method that provides linearity, high quality factor, and compact size.

2. Background Information

There is an ever increasing demand for smaller and smaller electronic devices with improved performance and additional features. Smart phones, tablets, laptop computers, and similar computing devices are now invariably expected to communicate using may different types of wireless networks such as 3G, 4G, Long Term Evolution (LTE) and other cellular, Wireless Fidelity (Wi-Fi), Near Field Communication (NFC), Global Positioning System (GPS), Bluetooth and still others. Indeed, to provide even just full connectivity to LTE networks, more than 40 potential radio frequency bands must be accommodated. Numerous analog and mixed signal design challenges exist as a result of the need to accommodate the resulting ranges of operating frequencies and wide bandwidths.

In addition, a "thin is in" requirement continues to reduce the space available for antennas and other radio frequency components needed to provide this connectivity.

Deep Sub-Micron Complimentary Metal Oxide Semiconductor (DSM-CMOS) Integrated Circuit (IC) technologies are increasingly used to implement the mixed-signal front-ends needed in these systems. DSM-CMOS provides the required high density circuit integration, while reducing the operating voltage available to any particular circuit. While this provides the dual advantage of high-frequency operation and reduced circuit area, the ability to handle the need for higher power is compromised, as a result of the lower voltage levels. Thus, mixed signal front ends remain at least one area where alternative IC technologies such as gallium arsenide (GaAs) still present an attractive option.

Considerations from the digital design domain include an important design trend towards using substrates that inherently provide capacitance within the substrate itself. These products, such as FaradFlex™ available from Oak Mitsui Technologies of Hoosick Falls, N.Y. are based on ultra-thin laminated, low impedance, low inductance and high capacitance substrates. Another important advantage of these substrates is that they reduce the need for discrete bypass capacitors, which might otherwise consume half the physical circuit board space or more. Embedded capacitance circuit board technologies are becoming and increasingly necessary component of high-frequency circuits. The ultra-thin form factor in turn also means that they are typically thought to be best suited for low voltage, low power applications.

It has also been known for many years to transform impedances in radio frequency circuits. A circuit known as a Guenella transformer is one type of transmission line transformer. The purpose of this transformer is to match the characteristic impedance, such as 50 ohms, of a transmission line carrying an input signal to a different input impedance of the circuits internal to a device. Impedance matching is necessary to provide maximum signal power transfer with minimal reflection.

SUMMARY

Problem Description

At present, radio frequency signal processing circuits such as filters and duplexers should exhibit relatively high Third-order Intercept Point (IP3) to handle weak receive signals in the presence of strong transmit signals, both those of interest to the receiver and interfering transmission.

There is an ever-increasing need for radio frequency circuits to operate over many different frequency bands that each have different required bandwidths. The most common approach is to provide a separate signal processing circuit, such as filter/duplexer, for each desired operating band. Individual filter/duplexer circuits are then interconnected with switches controlled by selection logic that enables one or more of the corresponding filter/duplexers depending upon the function desired. Problematically, these filter/duplexer networks are bulky, expensive and not easily re-configurable.

Summary of Preferred Solution(s)

The above-mentioned and other related problems motivate the present invention, a signal handling apparatus that enables implementation of agile signal processing circuits (such as filter/duplexers) with the following attributes: high IP3, so as not to sacrifice desired linearity performance that would otherwise be available by using Surface Acoustic Wave (SAW) or Thin Film Bulk Acoustic Bar Resonator (FBAR) technologies, as well as compact size and programmability.

The key innovation is an approach to signal handling that allows for high linearity while retaining small size and programmability of the underlying signal processing circuits. The signal handling approach described herein is advantageous in applications that require handling of high power signals, across wide operating frequencies and bandwidths, while still being ideally adapted to the currently preferred IC technologies (such as DSM-CMOS) and currently preferred embedded capacitance, extremely thin circuit board substrates (such as FaradFlex).

In one specific implementation, the signal handling apparatus includes an input impedance transformer for receiving an input signal and matching an input impedance of the apparatus to an internal apparatus impedance, a splitter for splitting an output of the first impedance transformer into N split signals, a number of signal processing circuits for processing the N split signals, a combiner for combining the N split signals into a combined signal, and output impedance transformer for receiving the combined signal and for matching the internal apparatus impedance to an output impedance of the apparatus.

The signal processing circuits may include filters, duplexers, or other radio frequency circuits. The splitter signal processing circuits, and combiner may typically have respective input and output impedances equivalent to the internal apparatus impedance.

In one arrangement, the signal processing circuits are resonators that include at least one vector inductor. The vector inductor may be constructed from a plurality of mutual, tightly coupled, layered, inductive structures. In still other arrangements, the resonators further comprise an array of capacitors; the capacitor array may be tunable to provide a tunable filter.

In an embodiment where the capacitor array is tunable, it may be preferred to also provide tunable, frequency dependent impedance matching networks at the input and output.

Another implementation for a tunable resonator and/or filter uses a suitable printed circuit board substrate, such as a FaradFlex substrate, to implement the vector inductor(s). One or more capacitor arrays, implemented as integrated circuit chips, are then mounted on the PC board. The PC board also provides interconnections between the inductors and capacitors to implement the resonator and/or filter.

BRIEF DESCRIPTION OF THE DRAWINGS

The detailed description below refers to the accompanying drawings, of which:

FIGS. 8A through 8D illustrate a frequency dependent matching network used with a tunable filter.

DETAILED DESCRIPTION OF AN ILLUSTRATIVE EMBODIMENT

Figure 1:
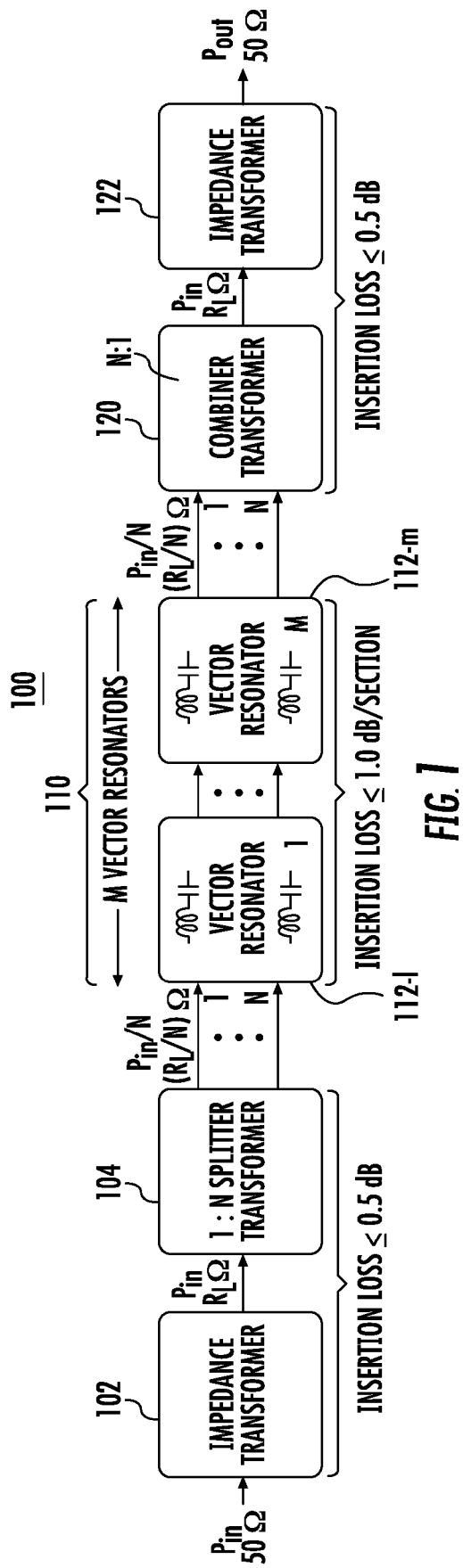
FIG. 1 is a schematic diagram of a signal handling apparatus.

FIG. 1 is a circuit diagram of one embodiment of a signal handling apparatus 100 according to one preferred embodiment of the invention claimed herein. The signal handling device 100 includes an input impedance transformer 102, a splitter transformer 104, a signal processing circuit 110, a combiner transformer 120 and an output impedance transformer 122. In the example circuit of FIG. 1, the signal processing circuit 110 is a filter composed of a set of M vector resonators 112-1, . . . , 112-M—it should be understood, however, that other types of signal processing circuits 110, such as band pass filters, band reject filters, duplexers, modulators, up- and down-converters, etc., may also be advantageously used in apparatus 100.

An input signal $P_{in}$, which may have an input impedance of 50 Ohms, is first provided to an input terminal of the input impedance transformer 102. The input signal (which may, for example be a radio frequency (RF) transmit or receive signal) undergoes impedance transformation by the impedance matching transformer 102, and as a result the impedance is dropped from 50 Ohms to $R_L$ Ohms, where $R_L$ is less than 50. This results in a voltage drop of $$\sqrt{\frac{50}{R_L}}.$$

Although not shown in FIG. 1 in detail, in a preferred arrangement, the output signal from transformer 102 is a differential mode signal, which is then forwarded to and processed by the remaining elements of apparatus 100.

The signal output from impedance transformer 102 is then split into N individual rails by the 1:N power splitter 104. This further drops the power level of each individual output rail by a factor of 1/N (such that each rail carries a signal of power $P_{in}/N$) and also drops voltage level of each individual output rail by a factor of $\sqrt{N}$.

The power splitter 104 also further transforms the impedance R to $R_1/N$, as per the notation at the output of splitter 104 in FIG. 1.

A corresponding number, N, of signal processing circuits 110, then processes the resulting N signals. In the embodiment shown, these N circuits are each implemented as a set of M vector resonators. An example set of vector resonators 112-1, . . . , 112-M filter a selected one of the N signal rails; in other words, there may be a series of M vector resonators applied to each signal path.

After the vector resonators 112 (or other processing implemented by the signal processing circuit 110), the resulting N signals are then recombined by the N:1 power combiner transformer 120. Combiner transformer 120 then combines the N individual rails (each with a power of $P_{in}/N$ and input impedance of $R_1/N$) back to signal $P_{in}$ of $R_L$ Ohms.

The final output impedance transformer 122 returns the circuit output impedance back to 50 Ohms at the terminal which provides the output signal, $P_{out}$.

The total effect of efficient impedance transforming networks 102, 122 and splitter/combiners 104, 120 can be shown to provide an improvement in linearity of $$12*\log_{10}\sqrt{\frac{50N}{R_L}}.$$

as compared to the case where the input signal Pin would instead be applied to the signal processing circuit 110 directly. In an example case where the number of rails, N=16, and $R_L$=1 Ohm, the linearity improvement is thus approximately 17 dB.

In order to maintain compact size and programmability in the signal handling apparatus 100, certain component designs are preferred for an embodiment that is to provide a filter and/or duplexer signal processing function. In the illustrated embodiment of FIG. 1, these filters/duplexers are generally indicated as being built from inductor-capacitor (LC) resonator structures 112. Each LC resonator structure 112 is in turn preferably built from a certain type of vector inductor and/or vector capacitor array.

As understood by those of skill in the art, a filter may typically include several inductors and capacitors, with the number of inductors and capacitors in the filter and their specific interconnection depends upon the type of filtering desired { bandpass, lowpass, etc.} and also depending upon the number of poles and zeros desired for such a filter. The discussion below is not concerned with that aspect of filter design, but rather the configuration of each individual inductor and capacitor component.

Briefly, the preferred design of each individual vector inductor uses tightly coupled, layered inductor pairs formed on a printed circuit board substrate. The tightly coupled inductor pairs should exhibit a high degree of mutual inductance. In one example embodiment, N mutually coupled inductors of inductance L with very tight coupling are fit into an area of size 1/N as compared to the size occupied by one uncoupled inductor (of value N*L). This results in a total reduction factor of $N^2$ in size for each inductor. For N=16, the reduction in size is therefore 256 times smaller than an uncoupled, non-layered inductor.

As described in more detail below, each vector capacitor is preferably constructed in silicon from an array of N capacitors each of size C. A key benefit of a capacitor array formed in deep submicron CMOS is that it offers very small size. As one example, a capacitance ratio of more than 3:1 can be achieved, and programmability is achieved through the use of a 10-bit digital word to select the capacitance value.

Figure 2A:
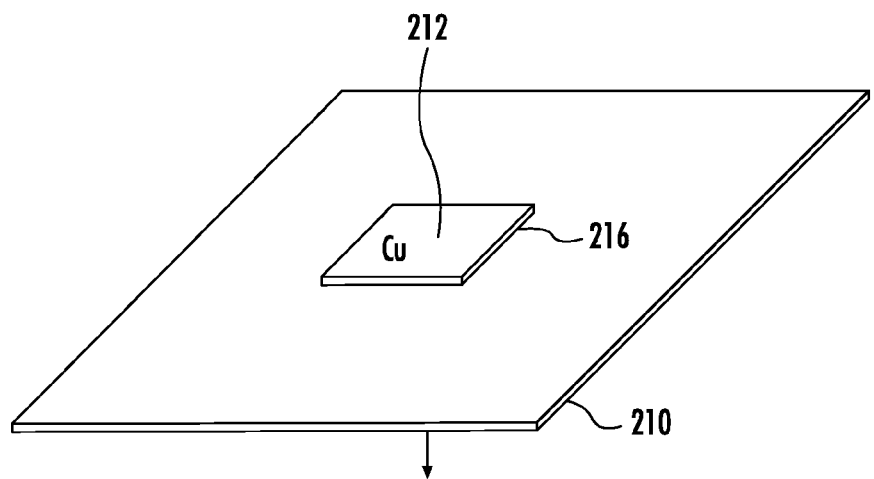
FIG. 2A is an isometric view of an inductor element.
Figure 2B:
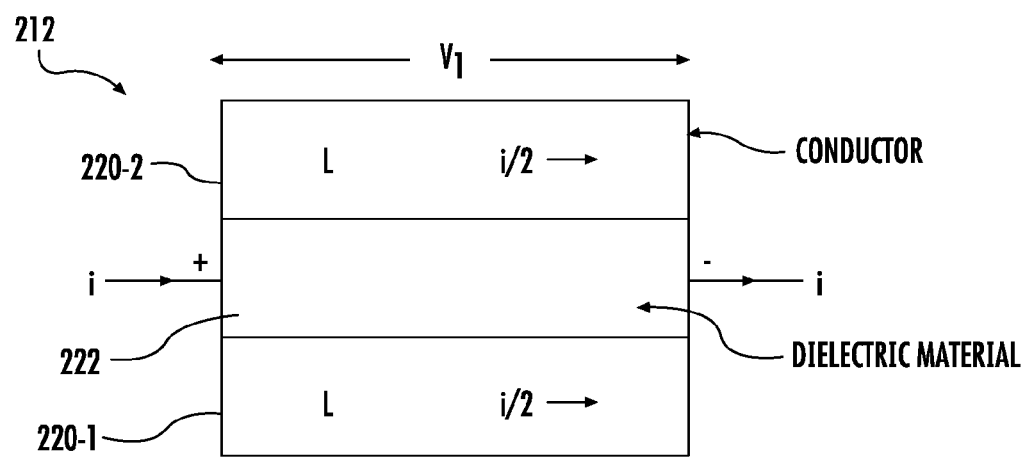
FIG. 2B is a cross section view of the inductor element of FIG. 2A.

FIGS. 2A and 2B illustrate one arrangement for a pair of tightly coupled inductor structures. As shown in the isometric view of FIG. 2A, the inductor 212 is formed from patches 216 of conductive material (such as copper) on a printed circuit board substrate 210, which may be FaradFlex or a microstrip substrate. The patches may be rectangles, elongated rectangles with tapered end portions, or assume other shapes.

As best shown in the cross-section detail of FIG. 2B, each inductor 212 is actually formed from multiple conductive patches 220-1, 220-2, each of inductance L, separated by a layer of insulating material 222. It can be shown that with this arrangement the relation can model the resulting component behavior $$V_1 = L\frac{d\frac{i}{2}}{dt} + M\frac{d\frac{i}{2}}{dt} = \left(\frac{L}{2} + \frac{M}{2}\right)\frac{di}{dt}$$

and we can conclude that:

$$V_1 = \left(\frac{L}{2} + \frac{kL}{2}\right)\frac{di}{dt} \approx L\frac{di}{dt} \text{ for } k \approx 1$$

where $V_1$ is the voltage applied across the inductor structure 212, L is the inductance of each patch 216, if M is a mutual inductance factor given by $$M = k\sqrt{L_1 L_2} = kL \text{ because } L_1 = L_2 = L$$

and where M is relatively high, such that the mutual inductance M approaches 0.95 or higher.

It should be noted that in comparing the closely coupled inductor pair architecture of FIGS. 2A and 2B with a simple single element inductor, the real part of the inductance is halved, while the total inductance has not changed. The result is that the quality factor Q is doubled while the total inductance remains at approximately L. for a given circuit area. For a single inductor pair 212 as shown in FIG. 2A, a Q of about 150 is possible.

A "skin effect" of radio frequency signals propagating via planar patches 212 causes currents to generally flow on the surfaces of patches 220, rather than through the entire thickness of the copper layer. Increasing the thickness of the copper patches 220 will have no effect on the skin effect. The skin effect limits the ability to increase the Q and the total inductance in the single pair inductor structure.

Figure 3:
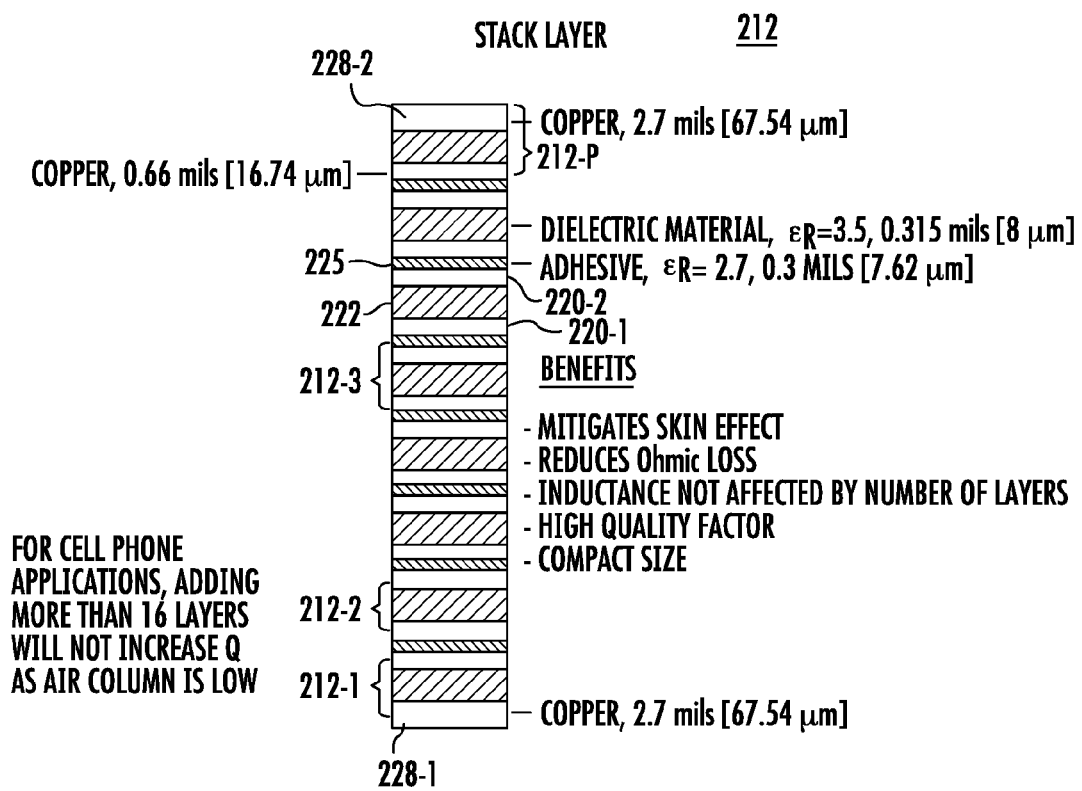
FIG. 3 is a cross section view of a vector inductor formed of stacked inductor elements.

However, the inductor pair configuration of FIGS. 2A and 2B can be extended to a multiple layer "vector inductor" configuration shown in FIG. 3. Here, a number, P, of closely coupled inductor pairs 212-1, 212-2, . . . , 212-g, . . . , 212-P are stacked together. As with the embodiments of FIGS. 2A and 2B, each inductor element is formed as a pair of conductive material patches 220-1, 220-2 disposed on either side of a dielectric substrate 222. The resulting 2*P conductive layers 220 are arranged vertically with respect to one another such that the patches of conductive material of the inductor elements are each vertically aligned with one another. Stacking multiple inductor pairs 212 in this way as a vector inductor forces at least some of the currents to flow though the middle of the structure in addition to the skin effect on the outer conductor layers 228-1, 228-2.

An adhesive layer 223 is disposed between adjacent ones of the inductor pairs 212; the adhesive is chosen to be relatively thin and have a relatively low static relative permittivity (dielectric constant) $\in_r$ so that a given inductor pair 212-g will exhibit tight coupling to its neighboring inductor pair located immediately above (inductor pair 212-g−1) and below (inductor pair 212-g+1).

Mutual coupling of the overall vector inductor structure is determined by the distance between the layers and the dielectric constant of the materials disposed between the conductors. For an internal conductive layer 220 thickness of approximately 0.66 mils (16.74 μm) and dielectric substrate layers 222 of approximately 0.315 mils (8 μm), one would prefer to have an $\in_r$ of the dielectric substrate of about 3.5 and an $\in_r$ of the adhesive layers 225 of about 2.7 (if the adhesive is 0.3 mils (7.62 μm) thick). The outer conductors 228-1, 228-2 may preferably be somewhat thicker than that of the internal conductive layers 220—here the outer conductors may be 2.7 mils (67.54 μm) thick.

Not shown in FIG. 3 are optional conductive side walls, disposed adjacent to the two or more edges of the conductive patches, and extending between the circuit layers. The conductive side walls may further assist with encouraging mutual inductance. In one arrangement where multiple vector inductors 212 are to be implemented in a circuit such as a filter, a predetermined spacing such as 0.5 mm is maintained between adjacent vector inductors 212 to avoid mutual coupling between vector inductors 212.

The stacked inductor of FIG. 3 provides important advantages over other approaches. Normally, a structure that includes P independent inductors of value L would consume a space that is P times larger than the space consumed by the single inductor L. However, in the case of the mutually coupled vector inductors of FIG. 3, the P mutually coupled inductors of size L, provided with very tight coupling, only requires a size 1/P, as compared to the space that would be occupied by a single uncoupled inductor (of value P*L). The total reduction in size is thus $P^2$ where N is the number of inductor pairs. Thus if P equals 16, the corresponding reduction in size is 256 times smaller than the case of the single inductor.

Vector inductors 212 formed of tightly coupled layers with mutual inductance of 0.95 or higher shown herein in tend to provide great improvement in the available Q factor of greater than 200 or more.

Figure 4A:
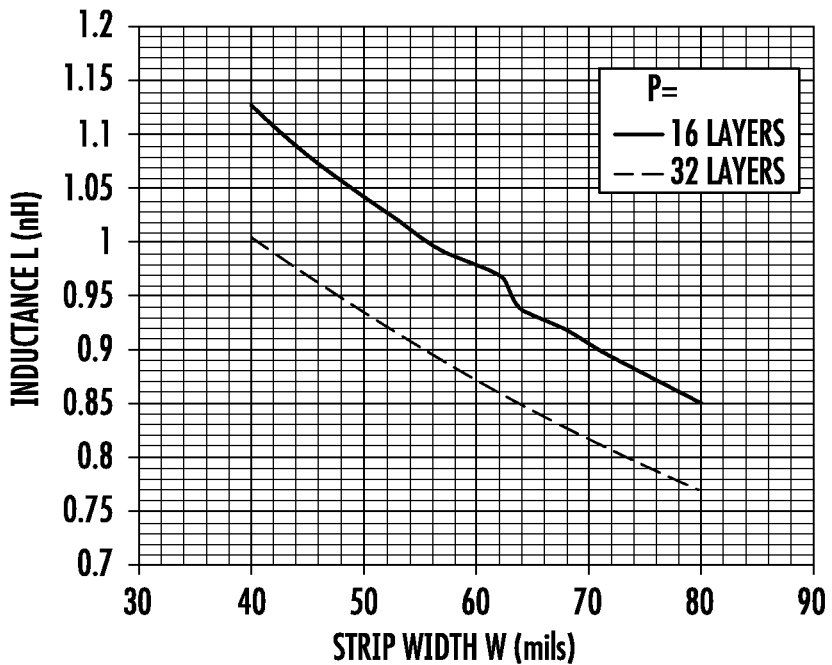
FIGS. 4A and 4B show inductance and quality factor of the stack layer inductor for 16 and 32 layers at 1 GigaHertz (GHz)
Figure 4B:
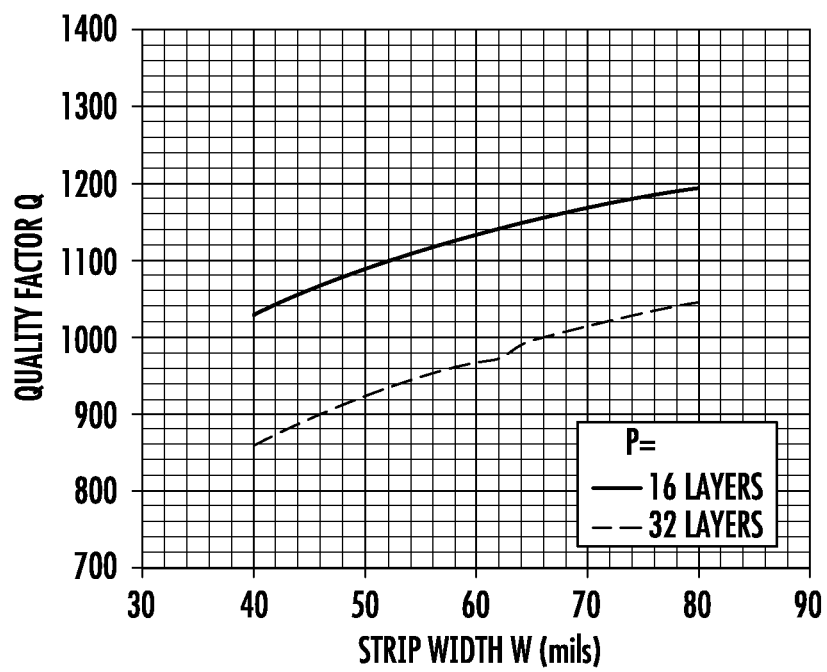

FIGS. 4A and 4B, respectively, show modeled inductance and quality factor provided at an operating frequency of 1 GHz for different conductive patch widths (in mils) and for two different numbers of inductor pairs (P=16 and P=32). The illustrated curves assume that a 250 mil thick air column is provided adjacent the top and bottom outer conductor layers 228-1, 228-2.

We turn now to a discussion of the preferred configuration for the capacitor structure used in the resonators of FIG. 1. As previously discussed, also makes use of a particular array technology. One might consider constructing the capacitors in silicon; the DSM-CMOS technology embodiment preferred here can provide a quite satisfactory programmable capacitance structure in a very small form factor.

A typical problem presented by most MOS capacitor designs is that they induce non-linearities. In practical implementations for radio frequency signal processing, such capacitors will typically exhibit an alternating alternating current (AC) effects that varies in magnitude with the signal applied. To minimize this effect, the vector capacitor structure preferred here is constructed from an array of N capacitors, each of size C. A key benefit of a DSM-CMOS capacitor array is that it offers very small size. A capacitance ratio of more than 3:1 can be achieved, with programmability achieved through the use of a 10-bit digital word to select the capacitance value. By operating the MOS junctions in a particular range, the non-linearity effects can also be reduced.

Figure 5A:
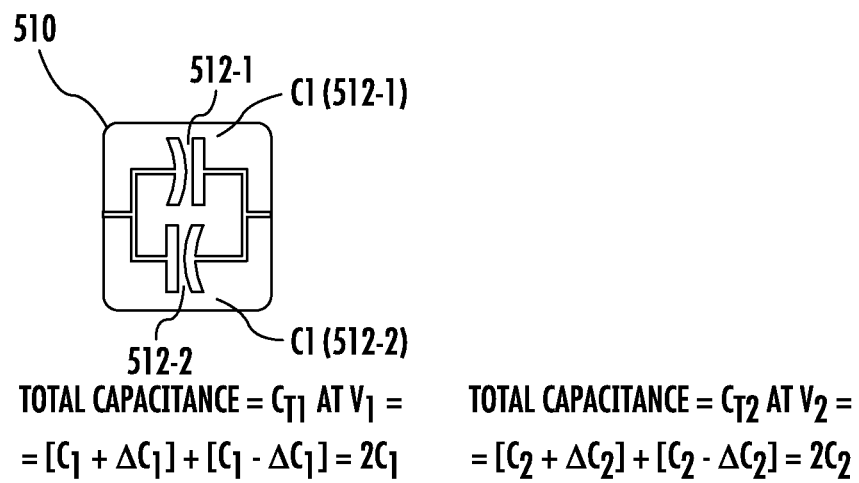
FIG. 5A is an anti-parallel capacitor element.
Figure 5B:
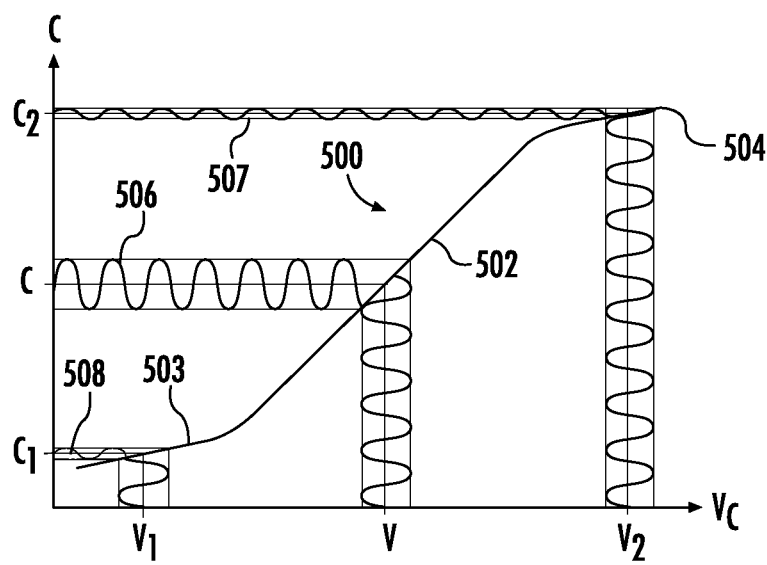
FIG. 5B shows the preferred operating voltage range of the capacitor element of FIG. 5A.

FIGS. 5A and 5B illustrate the preferred arrangement for each of the N capacitive elements 510 in a vector capacitor array. Here a pair of capacitive MOS structures 512-1, 512-2 are connected in an anti-parallel configuration such that the polarity of each of the two terminals of each capacitor is connected to the reverse polarity terminal of the other capacitor.

To reduce non-linearity effects, one therefore also selectively chooses a bias voltage. FIG. 5B illustrates an example curve 500 of capacitance, C, versus applied bias voltage, V, for an MOS capacitor. Most circuits are designed such that the bias voltage V is within a range where the slope of tends to operate in an area of the curve 502 providing generally linear and increasing slope. In the preferred arrangement here, however, the bias voltage is selected to be in a range of $V_1$ or $V_2$ where the capacitance variation with voltage is quite a bit smaller. While this restricts the range of available capacitance provided from each single MOS capacitor 512, the decrease in variation provide lesser variation in the presence of RF signals (as evident by comparing the output sinusoid 506 at V with the reduced amplitude sinusoids 507, 508 produced at $V_1$ and/or $V_2$.)

If the capacitance values of each element of the anti-parallel pair 512-1, 512-2 is the same, the total capacitance of the pair can be expressed as follows:

total capacitance $C_{T1}$ at $V_1 = [C_1 + \Delta C_1] + [C_1 - \Delta C_1]$
$= 2C_1$ and likewise total capacitance $C_{T2}$ at $V_2 = [C_2 + \Delta C_2] + [C_2 - \Delta C_2]$
$= 2C_2$ Thus the effect of any different in capacitance, $\Delta C$, as a result of the slope of curve 500 is cancelled as result of the anti-parallel configuration 510.

Figure 6:
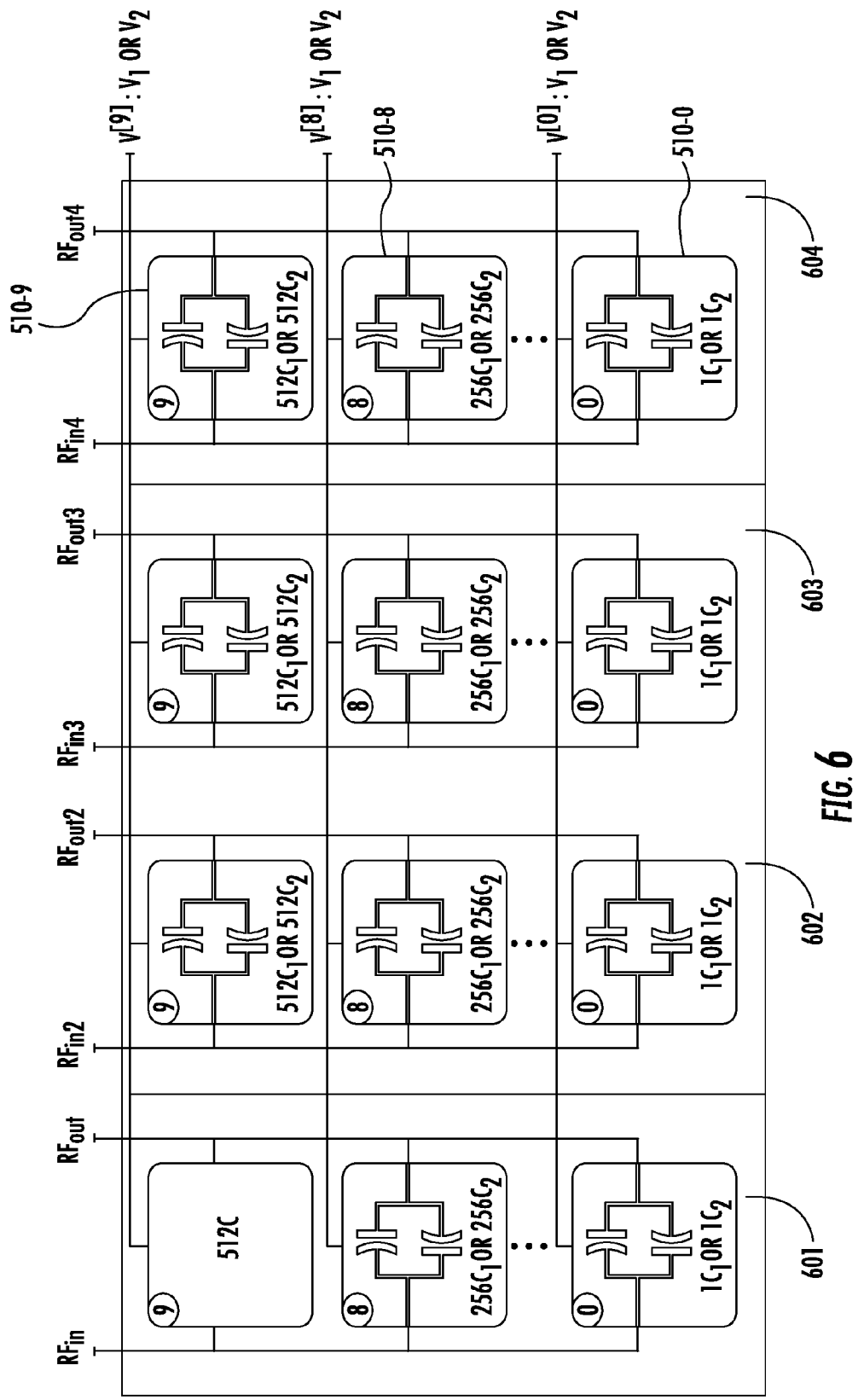
FIG. 6 is a schematic showing four arrays of capacitor elements each arranged as a programmable ladder.

FIG. 6 illustrates four different vector capacitor arrays, 601, 602, 603, 604 using the anti-parallel capacitor element structure 510 of FIG. 5A. An example array 604 consists of ten (10) such capacitor elements 510-0, . . . . . , 510-8, 510-9 arranged in a ladder. A given capacitor element 510 in the ladder provides a selectable amount of capacitance depending upon its corresponding applied bias voltage. A bias voltage, $V_1$ or $V_2$, is applied to each capacitor element 510 depending upon the value of a corresponding one of 10 digital control input bits V{0} through V{9}. Element 510-9 thus provides a selectable capacitance of $512C_1$ or $512C_2$ depending on the value of input V{9}, element 510-8 provides an a capacitance of $256C_1$ or $256C_2$ depending on the value of input V{8}, and so on down to element 510-0 which provides an output capacitance of 1 $C_1$ or 1 $C_2$ depending on the value of input V{0}.

In a case where the four arrays 601, 602, 603 and 604 are provided on the same chip substrate, the voltages applied to the bias terminals in one array 601 may be different than the bias voltages applied to the other arrays 602, 603, and 604. In an application such as a smart phone this permits the different arrays to be used to implement different filters tuned to different radio frequency bands.

Figure 7A:
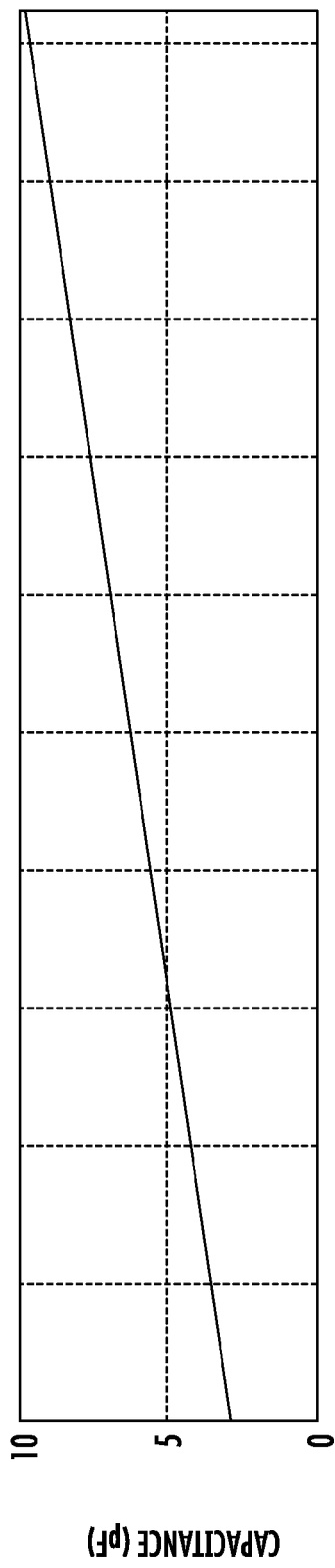
FIGS. 7A and 7B are capacitance and quality factor of one of the capacitor arrays of FIG. 6.
Figure 7B:
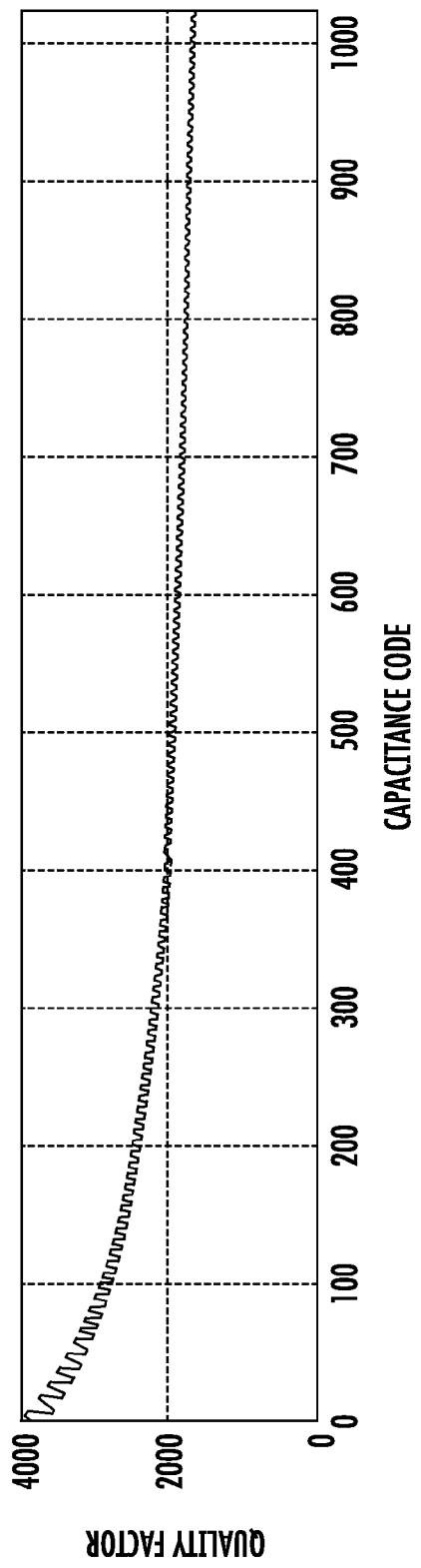

FIGS. 7A and 7B illustrate typical capacitance ranges and quality factor available from an vector capacitor array that was designed to provide selectable capacitance from 2.97 pF to 9.64 pF, with 10 bit control input (capacitance codes ranging from 0 to 1023) and a resulting step size of 6.6 pF. The curves were modeled assuming an input RF signal of 1 GHz.

As mentioned previously, these inductor and capacitor constructions can be paired to form vector resonators, which can then be cascaded to form vector filters. When combined with the signal handling innovations of impedance transformation and power splitting/combining, a highly linear, compact, and programmable vector filter results. As discussed in more detail below, multiple vector filters can also be used to construct a programmable duplexer.

An extention to the general signal handling concepts described above is to implement a frequency dependent impedance matching network with the resonator components. The approach is thus as shown in FIG. 8A, where a frequency dependent matching network 902 is disposed on the input side of a filter 910-A and a corresponding frequency dependent matching network 922 is disposed on the output side of the filter 910-A. As for the case of the FIG. 1 circuit, the input and output terminals have an expected impedance, R. However, the frequency dependent matching networks 902, 912 now adjust for the fact that the filter 910-A may itself be tuned to different frequencies.

Turning attention to FIG. 8B, the original filter 910-B (which may have been a transmit-side or receive-side filter of a tunable duplexer) was designed having inductance $L_s$ and capacitance $C_s$ to resonate at a center frequency $f_c$. Once tuned to a different frequency, the filter can be thought of as a frequency scaled filter 910-C of FIG. 8C that is designed to resonate at a frequency $\alpha f_c$ using an inductance $L_s/\alpha$ and capacitance $C_s/\alpha$. However, to take advantage of the signal handling and component design techniques discussed herein, the input impedance R should be scaled to $\alpha R$; and the scaled filter should be implemented with the equivalent fixed inductance $L_s$ but variable capacitance $C_s/\alpha^2$.

The result in FIG. 9D is a programmable filter 910-D having a frequency-dependent input and output impedance of $\alpha R$ with the equivalent fixed inductance $L_s$ and variable capacitance $C_s/\alpha^2$.

Thus an input frequency dependent matching network 902 is used on the input side to match the input impedance R of the filter to impedance $\alpha R$; likewise, an output frequency dependent matching network 922 matches impedance $\alpha R$ to the desired filter output impedance R. The frequency dependent matching networks 902, 912 can be controlled by a control circuit (not shown) that also sets the value for capacitance, $C_s$, of the resonator based on the desired operating frequency. By adding frequency dependent matching networks 902, 912 to the circuit of FIG. 1, a more consistant, even constant frequency response under frequency scaling is now enabled.

Figure 9:
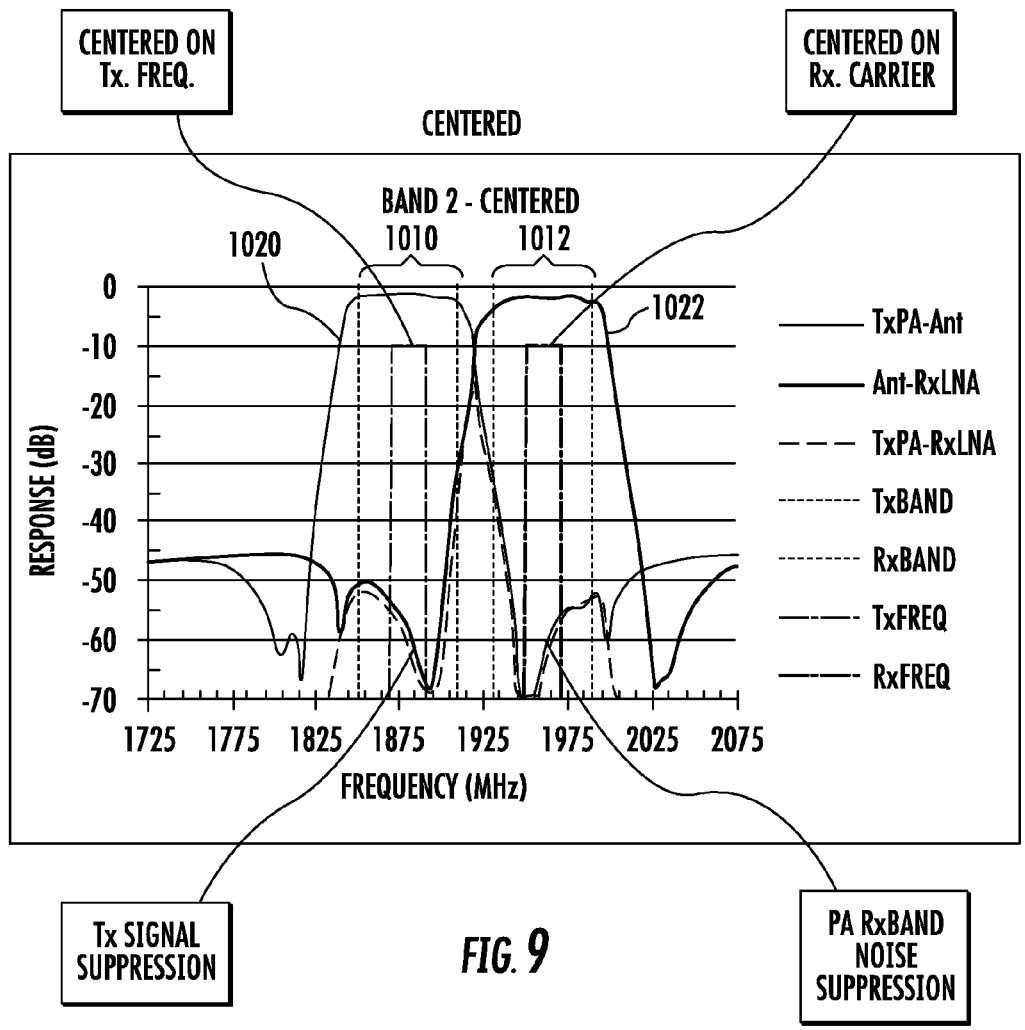
FIGS. 9, 10 and 11 are modeled frequency responses of a tunable duplexer.
Figure 10:
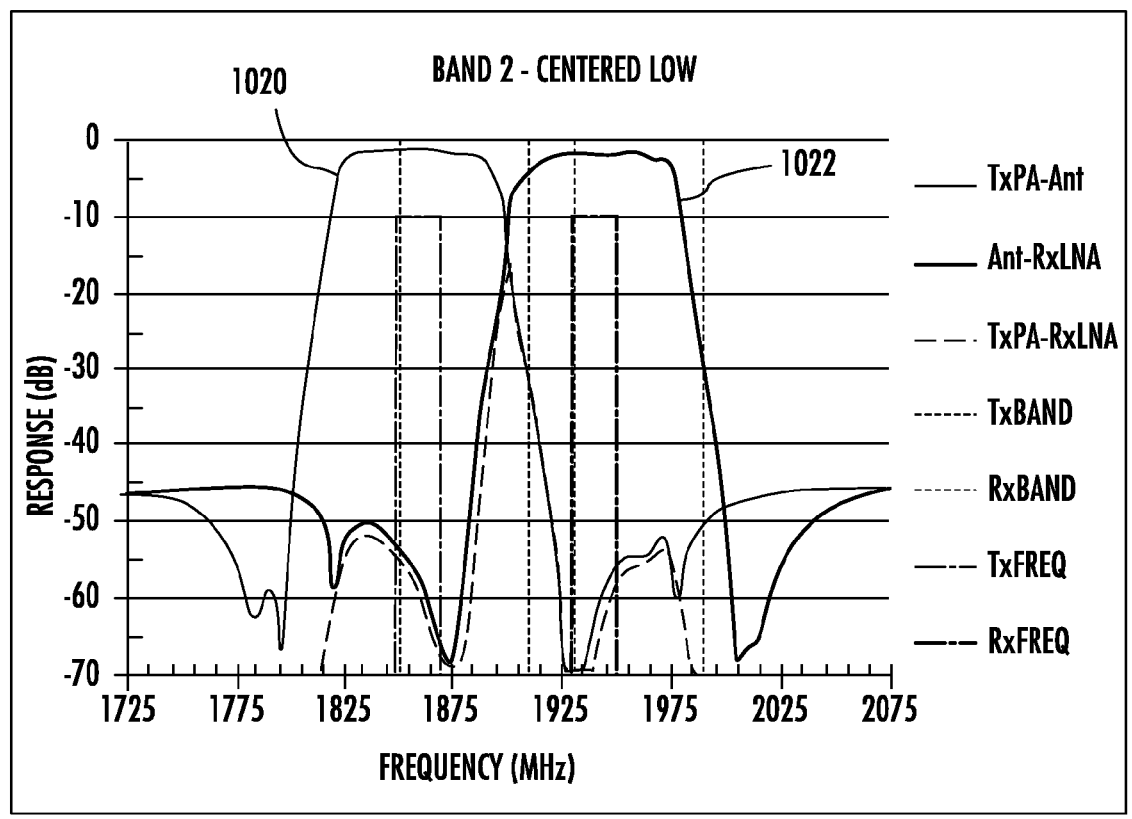
Figure 11:
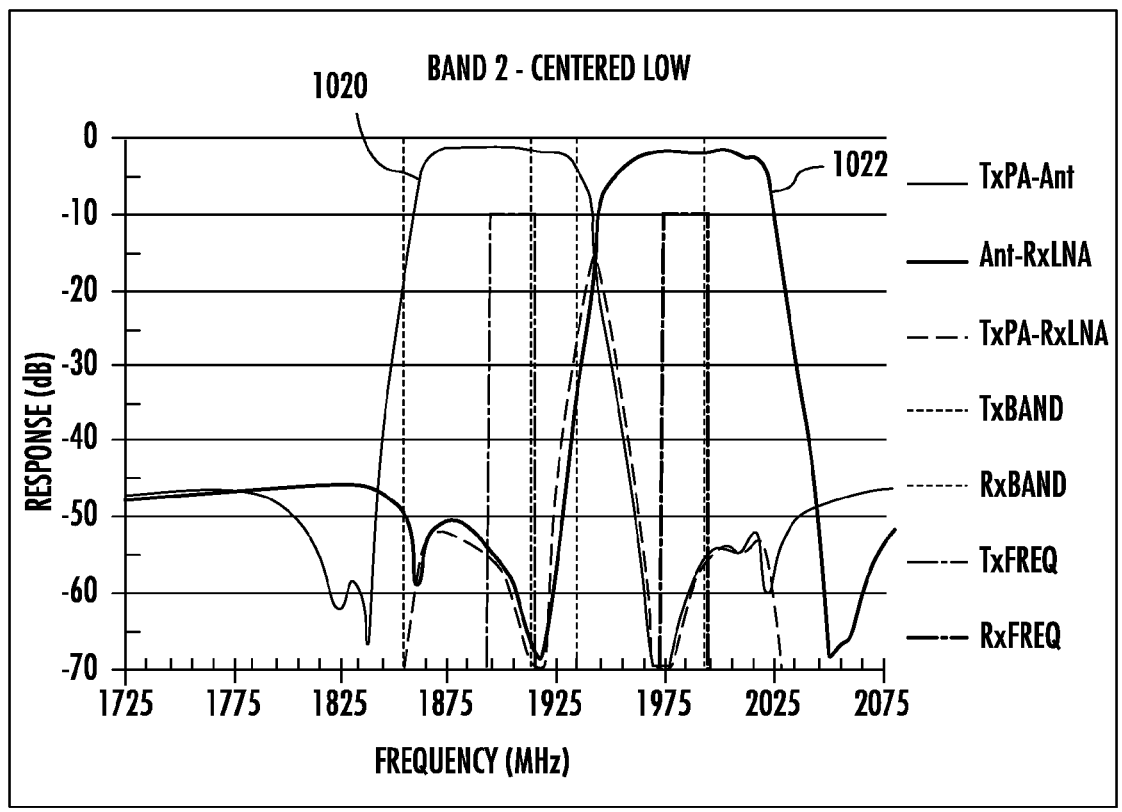

A comparison of the simulation results of FIG. 9, FIG. 10, and FIG. 11 illustrates the improved constant frequency response with a resonator having frequency-dependent impedance matching networks. The result is a duplexer that maintains a specific shape factor or percent bandwidth, even though the center frequency of the filters changes.

FIG. 9 is a first case where the transmit 1010 and receive 1012 filters are tuned to a channel in the center of the corresponding transmit and receive frequency bands. Note that the corresponding respective transmit 1020 and receive 1022 responses provide good suppression of interfering signals (that is, the harmonic of the transmitter signal in the receive band and the harmonic of the receiver in the transmit band are suppressed by −55 dB to about −70 dB.)

FIG. 10 illustrates the result when the transmit 1010 and receive 1012 filters are not tuned exactly in the center of the corresponding operating band but somewhat towards the low end; this configuration still exhibits good suppression of transmit signal power on the receiver side and good suppression of receiver bandwidth in the transmit range. The shape of responses 1020, 1022 have not appreciably changed from those that were exhibited in case where the filters were centered in their corresponding bands.

A similar simulation is shown in FIG. 11 when the filters 1010, 1012 are centered on a frequency that is relatively high within the respective transmit and receive bands—the corresponding responses 1020, 1022 again are not appreciably changed, and good suppression of harmonics is again observed.

As mentioned above, the filter design techniques discussed herein are particularly useful in front-end duplexers such as used in smartphones. As but one example, the LTE band of 700 MHz to 2.7 GHz can be partitioned into two sub-bands, one for the lower frequencies and one for the higher frequencies, and a vector filter can be constructed for each sub-band.

Figure 12:
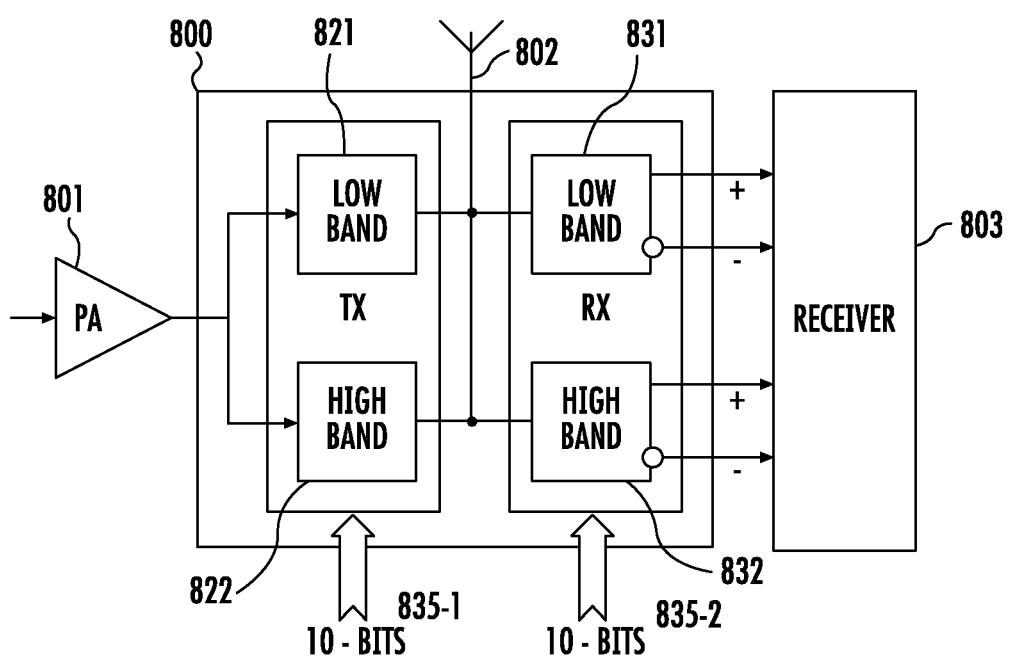
FIG. 12 is a high level block diagram of an example dual-band duplexer.

An example construction of such a duplexer is shown in FIG. 12. The duplexer 800 is constructed as an assembly disposed between a power amplifier 801, antenna 802, and receiver 803. Transmit and receive bands are processed separately for the high and low frequency bands, necessitating four filters (low band transmit 821, high band transmit 822, low band receive 831, and high band receive 832). Control words 835-1 (for the transmit side), 835-2 (for the receive side) of 10 bits each are applied to the vector capacitor arrays within the vector resonator structures; since the corresponding vector inductors are fixed in impedance, the control bits in turn to tune each of the duplexer filters to one of the respective LTE bands.

It is generally known that is it is desirable for a duplexer to suppress intermodulation products; current design requirements also mean that a duplexer is ideally tunable across a wide range of selectable center frequencies and bandwidths. A duplexer should also exhibit a relatively high third order intercept (IP3). Most prior solutions implement separate duplexers for the different expected radio frequency bands of operation (3G, 4G, LTE, Wi-Fi, Bluetooth, etc.). The need for multiple duplexers specific to each operating band not only increases the overall size of a wireless device, but necessitates the use of radio frequency switches and other components that introduce insertion loss, non-linearities, and other design complications.

Using the vector inductor and capacitor array structures described above, one can implement a duplexer 800 that is tunable by digitally adjusting the amount of capacitance in any given resonator within any given filter 821, 822, 831, 832. This design approach permits a single duplexer 800 to operate across a wide range of radio frequencies and bandwidths. However, if the capacitance of a resonator/filter changes, but the inductance must be kept constant, the result is that the overall impedance of the resonator changes.

Figure 13:
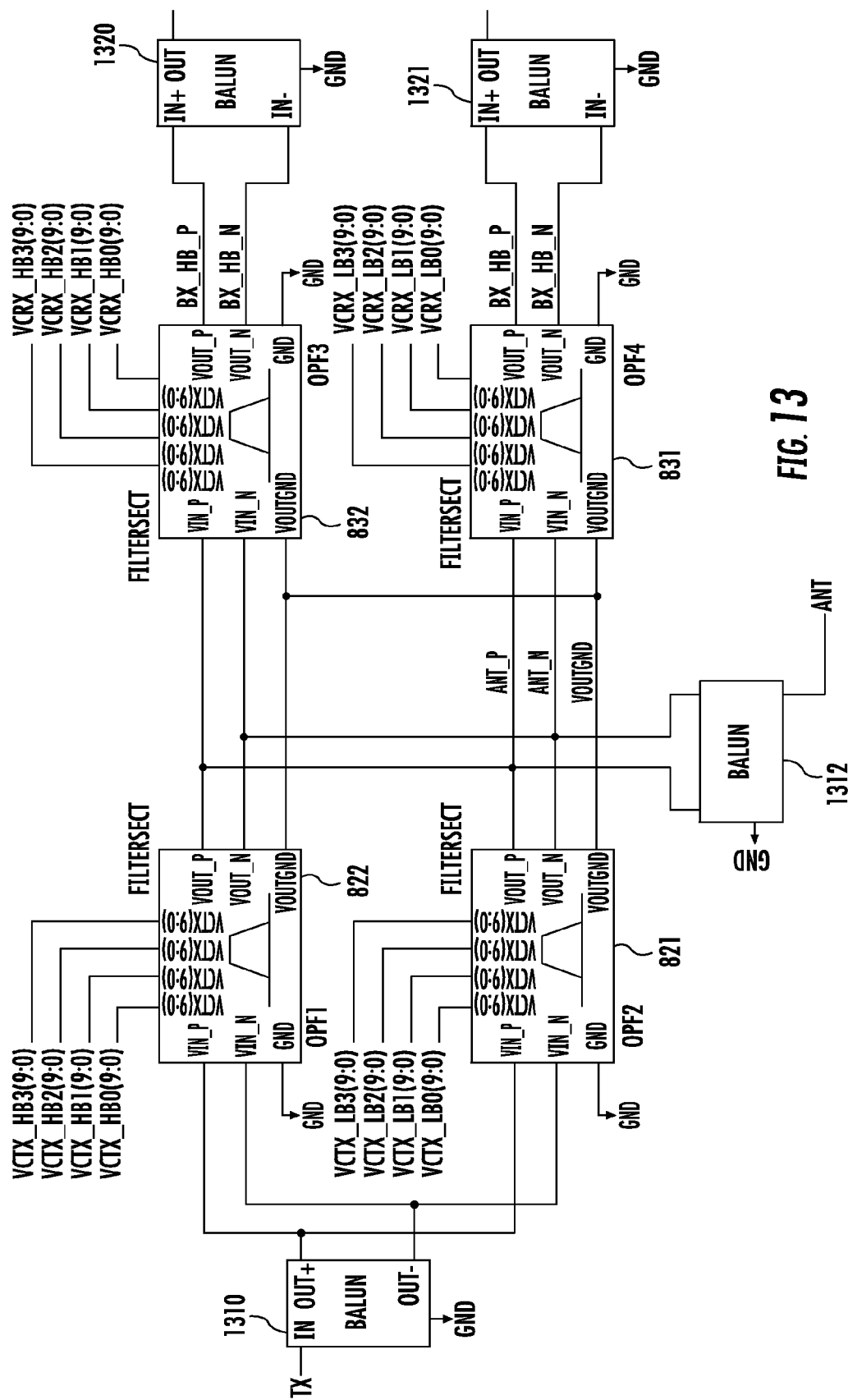
FIG. 13 is a more detailed diagram of the dual-band duplexer.

FIG. 13 is a more detailed circuit diagram of one possible implementation of the duplexer 800 shown in FIG. 12. An input transmit signal TX provided from an RF power is fed to a balun 1310. The balun provides a different pair of outputs (OUT+ and OUT−) to drive the pair of transmit filters for the low band 821 and high band 822.

A second balun 1312 takes the respective differential outputs (VOUT_P and VOU_N) from each of the transmit filters 821, 822 (along with a ground reference VOUTGND) and feeds these to an antenna terminal ANT. The balun 1312 also provides differential signals (ANT_P, ANT_N) from the antenna terminal ANT to drive the receive filters including the low band receive filter 831 and high band receive filter 832. Respective outputs from these receive filters 831, 832 are fed to differential inputs (IN_, IN−) at each of a pair of receive baluns 1320, 1321 and from there at respective output terminals (OUT) to receivers associated with each of the receive bands.

FIG. 13 also shows that each respective filter of the duplexer is a frequency-adjustable filter according to the teachings herein. In one implementation, the filters each include four adjustable resonators, with each resonator being a fixed inductor, adjustable capacitor resonator with frequency dependent, input and output matching networks as per FIG. 8A. Each filter may be designed as a higher-order Chebyshev filter in one implementation. The respective set of four (4), ten-(10) bit control inputs for each filter are shown. Thus the 4 digital signals (each of 10-bits) with prefix VCTX_LB tune the low band transmit side, the four digital signals with prefix VCTX_HB tune the high band transmit site, the four signals VCRX_LB tune the low band receive side and VCRX_HB tunes the high band receive side.

Figure 14:
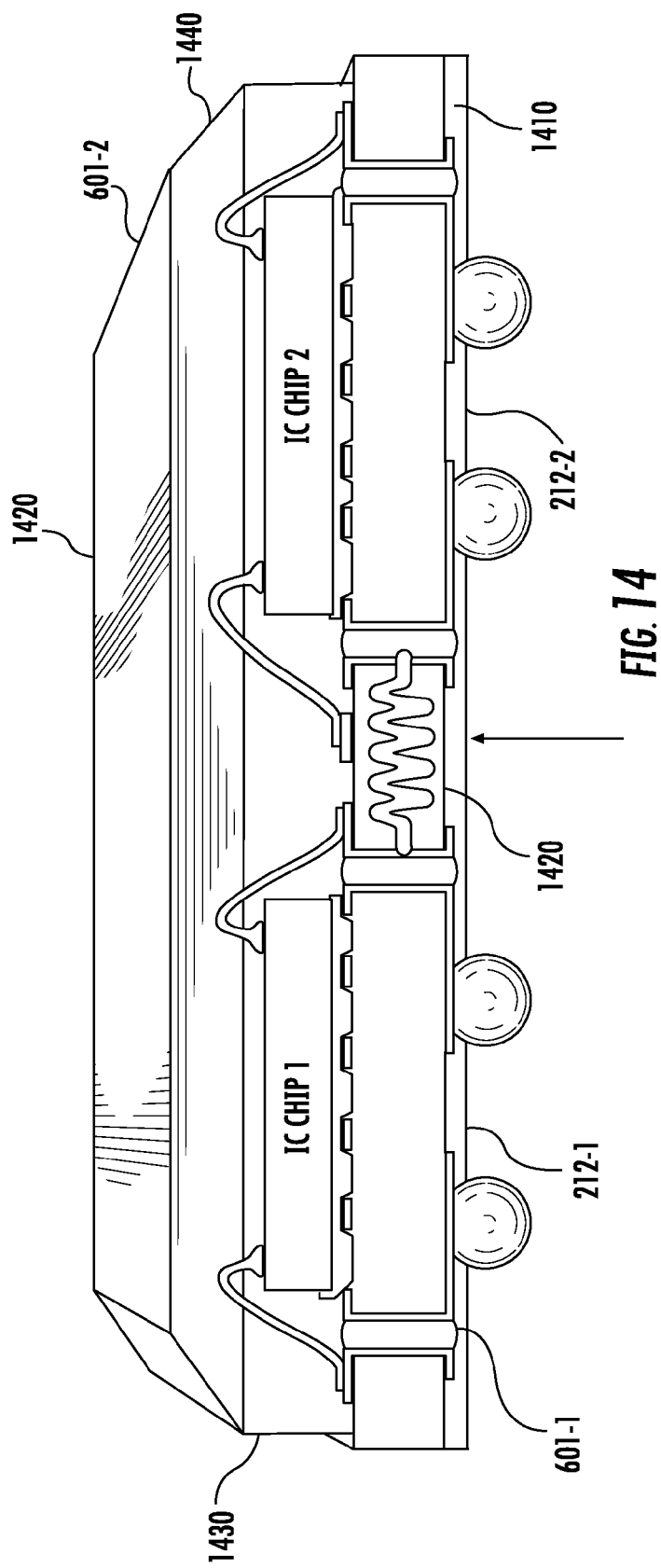
FIG. 14 shows a preferred packaging arrangement.

FIG. 14 shows one possible packaging arrangement for a signal handling circuit that makes use of the vector inductor and array capacitor techniques described above. In this cutaway view, a suitable printed circuit board substrate 1410 is a FaradFlex substrate as mentioned previously. The substrate 1410 is used to implement vector inductors 212-1, 212-2, . . . 212-K, up to a desired number, K, of vector inductors. One or more array capacitors 601-1, 601-2, . . . , 601-D are implemented as integrated circuit chips.

The substrate 1410 thus serves to both implement the vector inductors 212 as well as serving as a physical support for the array capacitors 601. As shown, resistive components 1420 may also be provided on or within the printed circuit board substrate 1410. Connecting wires 1430 may interconnect the components of the apparatus, and the entire assembly may be encapsulated by a shield 1440 in an appropriate fashion.

Figure 15:
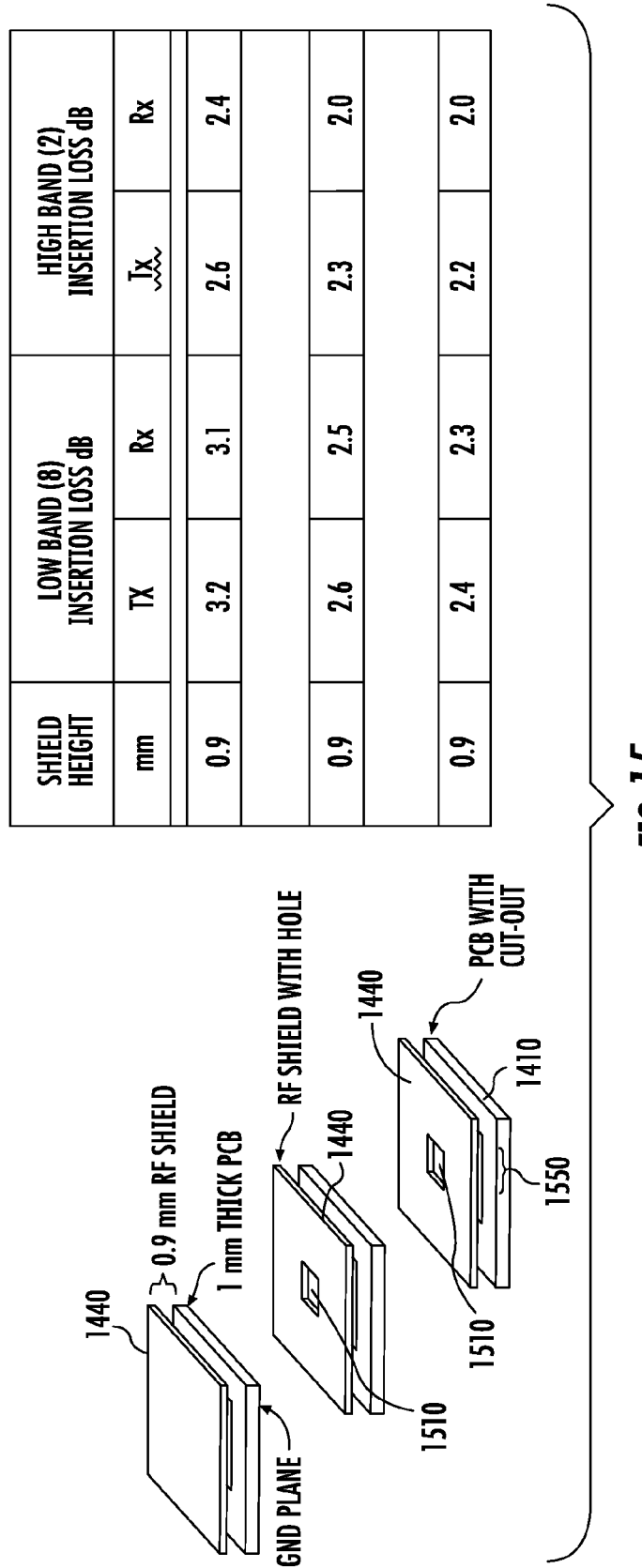
FIGS. 15 and 16 show low band and high band insertion loss for different shield heights for the duplexer.
Figure 16:
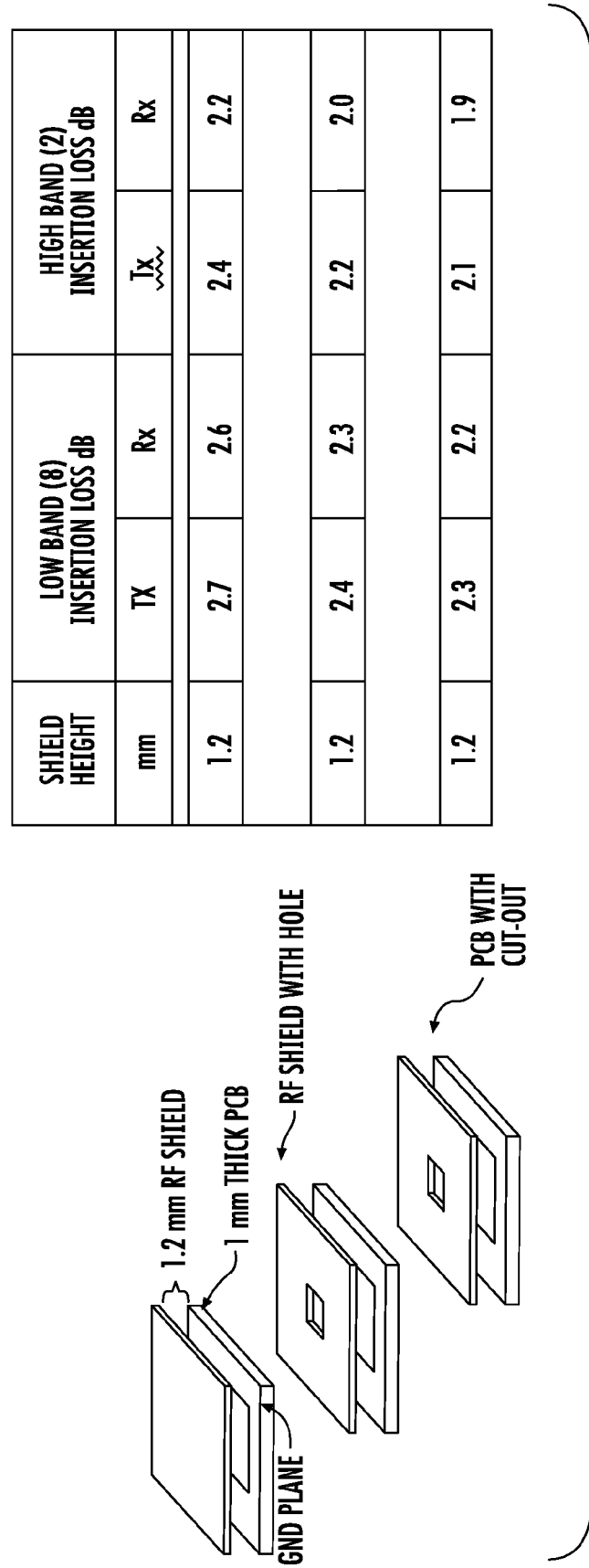

FIGS. 15 and 16 illustrate further desired characteristics of the mechanical configuration. As has been mentioned briefly previously, it is desirable to leave an air column above and/or or below the vector inductor 212, with the air column being adjacent the top and/or bottom outer conductor layers 228-1, 228-2 of each such inductor 212. The table in FIG. 15 illustrates the effect of maintaining a shield height, that is, the separation between the shield 1440 and printed circuit board 1410 (ground plane) of 0.9 mm for various configurations.

A first row of the table shows modeled insertion loss for the low band and high band filters for a configuration where there is no hole cut in either the shield 1440 or substrate 1410. A second configuration in the second row of the table has a hole 1510 cut in the RF shield 1440 but no hole in the substrate 1410. A third implementation where there is both a hole cut in the RF shield 1440 as well as in the printed circuit board 1410 has modeled insertion losses listed in the bottom row of the table.

FIG. 16 is a diagram and table illustrating similar predicted insertion loss characteristics for both the high band and low band filters, for each of the three illustrated hole configurations, but with a different shield height of 1.2 mm.

While various embodiments have now been particularly shown in the drawings and described in the text above, it will be understood by those skilled in the art that various changes in form and details may be made therein without departing from the scope of the teachings herein. It is intended, therefore, that the invention be limited only by the claims that follow.

What is claimed is:

1. An apparatus comprising:
 a first impedance transformer, for receiving an input signal, and matching an input impedance of the apparatus to an internal apparatus impedance;
 a splitter, for splitting an output of the first impedance transformer into N split signals;
 a plurality of signal processing circuits, for processing the N split signals, wherein at least one of the plurality of signal processing circuits includes a duplexer, the duplexer includes a high band filter circuit and a low band filter circuit, wherein at least one of the high band filter circuit and the low band filter circuit includes a resonator, the resonator including at least one vector inductor;
 a combiner, for combining the N split signals into a combined signal; and
 a second impedance transformer, for receiving the combined signal, and for matching the internal apparatus impedance to an output impedance of the apparatus.

2. The apparatus of claim 1 wherein the splitter, signal processing circuits, and combiner have respective input and output impedances equivalent to the internal apparatus impedance.

3. The apparatus of claim 1 wherein a selected one of the plurality of signal processing circuits is coupled to filter a corresponding one of the N split signals.

4. The apparatus of claim 1 wherein at least one of the plurality of signal processing circuits is a filter circuit.

5. The apparatus of claim 1 wherein the at least one vector inductor comprises a plurality, M, of mutual, tightly coupled, layered, inductive structures.

6. The apparatus of claim 5 wherein the vector inductor further comprises:
 a plurality, M, of inductor elements disposed as a corresponding plurality of circuit layers, the inductor elements each formed as a patch of conductive material, and the circuit layers arranged vertically with respect to one another such that the patches of conductive material of the inductor elements are vertically aligned with one another;
 a plurality of insulating material layers disposed between respective pairs of the circuit layers carrying the inductor elements; and
 wherein each respective inductor element is tightly coupled to one or more adjacent inductor elements disposed in a circuit layer above and/or below the respective inductor element.

7. The apparatus of claim 6 wherein each inductor element is formed as a generally rectangular patch of conductive material.

8. The apparatus of claim 6 wherein the circuit layers and insulating material layers for each inductor are formed on a microstrip circuit board.

9. The apparatus of claim 6 wherein at least one of the resonators further comprises:
 an array capacitor providing an adjustable capacitance, the array capacitor formed from a plurality of capacitance cells, each capacitance cell further coupled between the first and second terminals, each unit capacitance cell comprising a pair of passive, two-terminal capacitor components, each capacitor component having an anode terminal and a cathode terminal and a bias voltage input terminal, the pair of capacitors connected in anti-parallel, such that an anode of a first capacitor is connected to a cathode of a second capacitor, and an anode of the second capacitor is connected to a cathode of the first capacitor.

10. The apparatus of claim 9 wherein the array capacitor is formed on a semiconductor chip substrate.

11. The apparatus of claim 10 wherein the array capacitor semiconductor chip is mounted to the printed circuit board that provides the vector inductor structure.

12. The apparatus of claim 1 wherein at least one of the resonators further comprise an array of capacitors.

13. The apparatus of claim 12 wherein the at least one resonator is tunable by changing a capacitance of the capacitor array.

14. The apparatus of claim 13 wherein the resonators further comprise frequency dependent matching networks to enable a constant frequency response under frequency scaling.

15. The apparatus of claim 14 wherein the frequency dependent matching networks adjust to a change in the internal impedance of the apparatus as a result of a change in the capacitance of the capacitor array.

16. An apparatus comprising:
 a first impedance transformer, for receiving an input signal, and matching an input impedance of the apparatus to an internal apparatus impedance;
 a splitter, for splitting an output of the first impedance transformer into N split signals;
 a plurality of signal processing circuits, for processing the N split signals;
 a combiner, for combining the N split signals into a combined signal; and
 a second impedance transformer, for receiving the combined signal, and for matching the internal apparatus impedance to an output impedance of the apparatus, wherein the input impedance is K ohms, the internal impedance is R ohms, and the first impedance transformer further reduces a voltage of the input signal by a factor of $$\sqrt{\frac{K}{R}}.$$

17. The apparatus of claim 16 wherein at least one of the signal processing circuits includes a duplexer that further includes high band and low band filter circuits.

18. The apparatus of claim 16 wherein the splitter further drops a voltage level by a factor of $\sqrt{N}$.

19. A method for handling an input signal comprising:
a first step of impedance transforming to transform an input impedance to match an internal impedance;
splitting an output of the first step of impedance transforming into N split signals;
signal processing the N split signals, wherein the signal processing performs a duplexing function and filtering of a corresponding one of the N split signals, the filtering performed using resonators including at least one vector inductor;
combining the N split signals into a combined signal; and
a second step of impedance transforming, for matching an internal impedance to an output impedance, and to provide an output signal.

20. The method of claim 19 wherein the splitting, signal processing, and combining steps provide respective input and output impedances equivalent to the internal impedance.

21. The method of claim 19 wherein the at least one vector inductor comprises a plurality, M, of mutual, tightly coupled, layered, inductive structures.

22. The method of claim 19 wherein at least one of the resonators further comprise an array of capacitors.

23. A method for handling an input signal comprising:
a first step of impedance transforming to transform an input impedance to match an internal impedance;
splitting an output of the first step of impedance transforming into N split signals;
signal processing the N split signals;
combining the N split signals into a combined signal; and
a second step of impedance transforming, for matching an internal impedance to an output impedance, and to provide an output signal, wherein the input impedance is K ohms, the internal impedance is R ohms, and the first step of impedance transforming further reduces a voltage of the input signal by a factor of $$\sqrt{\frac{K}{R}}.$$

24. The method of claim 23 wherein the signal processing step performs a duplexing function.

25. The method of claim 23 wherein the splitting step further drops a voltage level by a factor of $\sqrt{N}$.

* * * * *